(12) United States Patent
Gerun

(10) Patent No.: US 10,408,369 B2
(45) Date of Patent: Sep. 10, 2019

(54) FLANGE TAB SYSTEM

(71) Applicant: Tony Gerun, Westlock (CA)

(72) Inventor: Tony Gerun, Westlock (CA)

( * ) Notice: Subject to any disclaimer, the term of this patent is extended or adjusted under 35 U.S.C. 154(b) by 0 days.

(21) Appl. No.: 15/782,164

(22) Filed: Oct. 12, 2017

(65) Prior Publication Data
US 2019/0113160 A1    Apr. 18, 2019

(51) Int. Cl.
| | |
|---|---|
| *F16L 23/00* | (2006.01) |
| *F16L 58/00* | (2006.01) |
| *C23F 13/18* | (2006.01) |
| *C23F 13/10* | (2006.01) |
| *C23F 13/20* | (2006.01) |
| *C23F 13/06* | (2006.01) |
| *F16L 58/18* | (2006.01) |
| *C23F 13/08* | (2006.01) |
| *B63B 59/00* | (2006.01) |
| *C23F 13/16* | (2006.01) |
| *C23F 13/02* | (2006.01) |
| *F16L 57/00* | (2006.01) |

(52) U.S. Cl.
CPC ............ *F16L 23/006* (2013.01); *C23F 13/06* (2013.01); *C23F 13/10* (2013.01); *C23F 13/18* (2013.01); *C23F 13/20* (2013.01); *F16L 58/00* (2013.01); *F16L 58/18* (2013.01); *B63B 59/00* (2013.01); *C23F 13/02* (2013.01); *C23F 13/08* (2013.01); *C23F 13/16* (2013.01); *C23F 2213/31* (2013.01); *C23F 2213/32* (2013.01); *F16L 57/005* (2013.01); *H01L 2224/42* (2013.01)

(58) Field of Classification Search
CPC .......... C23F 13/18; C23F 13/10; C23F 13/02; C23F 13/06; C23F 13/16; C23F 2213/32; C23F 2213/31; F16L 23/003; F16L 58/00; F16L 57/005; F16L 58/18; B63B 59/00
See application file for complete search history.

(56) References Cited

U.S. PATENT DOCUMENTS

| | | | | |
|---|---|---|---|---|
| 1,506,307 A | * | 8/1924 | Kirkaldy | C02F 1/46109 174/18 |
| 1,514,903 A | * | 11/1924 | Gush | C23F 13/18 138/DIG. 6 |
| 2,805,987 A | * | 9/1957 | Thorn, Jr. | C23F 13/18 174/152 R |
| 2,851,414 A | * | 9/1958 | Hubbard | C23F 13/18 204/196.2 |
| 2,860,781 A | * | 11/1958 | Randall | B63B 59/04 204/196.31 |

(Continued)

FOREIGN PATENT DOCUMENTS

| | | |
|---|---|---|
| CA | 2152742 | 12/1995 |
| CA | 2639607 | 3/2010 |

*Primary Examiner* — Jonathan Liu
*Assistant Examiner* — Taylor L Morris
(74) *Attorney, Agent, or Firm* — Integrity Patent Group, PLC; Charles E. Runyan

(57) ABSTRACT

A flange tab system includes a first member having a first-member-first-portion and a first-member-second-portion, a second member having a second-member-first portion and a second-member-second-portion, a third member, and a ring-like member. The flange tab system provides an electrical fitting for electrical current flow between pipelines or other structures. The flange tab system is configured to secure a wire to a pipeline for cathodic protection and various other applications.

15 Claims, 5 Drawing Sheets

(56) References Cited

U.S. PATENT DOCUMENTS

| | | | | |
|---|---|---|---|---|
| 2,910,421 A * | 10/1959 | Sabins | .................... | C23F 13/04 |
| | | | | 204/196.11 |
| 2,996,445 A * | 8/1961 | Eisenberg | ............... | C23F 13/16 |
| | | | | 204/196.32 |
| 3,019,177 A * | 1/1962 | Anderson | ............... | C23F 13/18 |
| | | | | 204/196.34 |
| 3,022,243 A * | 2/1962 | Anderson | ............... | C23F 13/06 |
| | | | | 204/196.31 |
| 3,058,086 A * | 10/1962 | Zwanzig | ................. | C23F 13/18 |
| | | | | 174/152 R |
| 3,117,070 A * | 1/1964 | Anderson | ............... | C23F 13/04 |
| | | | | 204/196.02 |
| 3,408,280 A * | 10/1968 | Preiser | .................... | C23F 13/06 |
| | | | | 174/151 |
| 3,445,370 A * | 5/1969 | Sherman | ................. | C23F 13/06 |
| | | | | 138/103 |
| 3,454,704 A * | 7/1969 | Lowery | ................... | C23F 13/18 |
| | | | | 174/151 |
| 3,497,444 A * | 2/1970 | Paiton | ..................... | C23F 13/18 |
| | | | | 174/152 R |
| 3,620,951 A * | 11/1971 | Bremerman | .......... | C02F 1/4602 |
| | | | | 122/4 R |
| 3,772,179 A * | 11/1973 | Beer | ....................... | C23F 13/02 |
| | | | | 204/196.17 |
| 3,977,956 A * | 8/1976 | Bagnulo | ............. | F16L 13/0263 |
| | | | | 204/196.33 |
| 4,051,007 A * | 9/1977 | Hossle | ................... | C23F 13/22 |
| | | | | 204/196.07 |
| 4,140,614 A * | 2/1979 | McKie | .................... | F16L 58/00 |
| | | | | 204/196.15 |
| 4,209,889 A * | 7/1980 | Silva | ....................... | B63B 59/00 |
| | | | | 29/432 |
| 4,309,263 A * | 1/1982 | Boyd | .................... | E02B 17/027 |
| | | | | 204/196.17 |
| 4,397,726 A * | 8/1983 | Schwert | ................. | C23F 13/02 |
| | | | | 204/196.18 |
| 4,445,989 A * | 5/1984 | Kumar | .................... | C23F 13/02 |
| | | | | 204/196.36 |
| 4,740,106 A * | 4/1988 | Bianchi | ................... | C23F 13/18 |
| | | | | 204/196.34 |
| 4,778,949 A * | 10/1988 | Esterle | ................. | H01R 13/746 |
| | | | | 174/151 |
| 6,332,478 B1 | 12/2001 | Holden | | |
| 6,461,082 B1 * | 10/2002 | Smith | .................... | C23F 13/10 |
| | | | | 204/196.17 |
| 6,673,469 B2 * | 1/2004 | Isaccsson | ................ | C23F 15/00 |
| | | | | 411/902 |
| 7,081,187 B1 * | 7/2006 | Schutt | ..................... | C23F 13/10 |
| | | | | 204/196.11 |
| 7,258,780 B2 * | 8/2007 | David Filho | .......... | C23F 13/10 |
| | | | | 205/730 |
| 7,329,336 B2 * | 2/2008 | Britton | ..................... | C23F 13/10 |
| | | | | 204/196.17 |
| D594,329 S | 6/2009 | McEldowney | | |
| 7,655,116 B1 * | 2/2010 | Tilsner | .................... | C23F 13/18 |
| | | | | 204/196.15 |
| 7,857,950 B1 * | 12/2010 | North | ..................... | C23F 13/18 |
| | | | | 204/196.17 |
| 8,443,844 B2 | 5/2013 | Zeyfang | | |
| 2005/0025608 A1 * | 2/2005 | Fedor | .................... | B63H 21/10 |
| | | | | 411/337 |
| 2005/0284771 A1 * | 12/2005 | David Filho | .......... | C23F 13/10 |
| | | | | 205/740 |
| 2007/0029191 A1 * | 2/2007 | Sewell | .................... | B63B 59/00 |
| | | | | 204/297.01 |
| 2012/0007358 A1 | 1/2012 | Mackey et al. | | |
| 2013/0081955 A1 * | 4/2013 | Al-Mubasher | .......... | C23F 13/16 |
| | | | | 205/724 |
| 2015/0259807 A1 * | 9/2015 | de Pierola | ............ | C23F 13/005 |
| | | | | 204/196.21 |
| 2015/0354766 A1 * | 12/2015 | Townsend, Jr. | ...... | F16M 13/022 |
| | | | | 362/370 |
| 2017/0211191 A1 * | 7/2017 | Gaunce | ............... | C02F 1/46104 |

* cited by examiner

FLANGE TAB SYSTEM

BACKGROUND OF THE INVENTION

The following includes information that may be useful in understanding the present disclosure. It is not an admission that any of the information provided herein is prior art nor material to the presently described or claimed inventions, nor that any publication or document that is specifically or implicitly referenced is prior art.

1. Field of The Invention

The present invention relates generally to the field of adaptors and connectors and more specifically relates to corrosion protector attachments.

2. Description of Related Art

Various industrial pipelines may require cables or wires to be affixed to the exterior of a pipeline. In some applications, doing so may be inconvenient. Further, as pipelines are often run through adverse environments, such connections must also be durable. Examples of adverse environments may be underwater and underground pipelines. Common applications are: steel water or fuel pipelines and steel storage tanks such as home water heaters; steel pier piles; ship and boat hulls; offshore oil platforms and onshore oil well casings; offshore wind farm foundations and metal reinforcement bars in concrete buildings and structures. Another common application is in galvanized steel, in which a sacrificial coating of zinc on steel parts protects them from rust. A suitable solution is desired.

U.S. Pub. No. 2012/0007358 to Lucas C. Mackey relates to a gasket retention system for flange coupling. The described gasket retention system for flange coupling includes a gasket retention system and flange coupling having a ring gasket that disposes in seal seats on opposing flanges. One or more retainer tabs extend from an outer periphery of the ring gasket. Preferably, the ring gasket defines a slot on the outer periphery, and the retainer tab affixes with an interference fit in the slot to be held therein. The retainer tab defines a transverse opening therethrough. When the ring gasket fits into the seal seat of one of the flanges, the transverse opening of the tab fits onto a fastener affixed in a pre-drilled hole in the face of the flange.

BRIEF SUMMARY OF THE INVENTION

In view of the foregoing disadvantages inherent in the known adaptors and connectors art, the present disclosure provides a novel flange tab system. The general purpose of the present disclosure, which will be described subsequently in greater detail, is to provide an electrical fitting for wire and cable connections and various other applications.

A flange tab system is disclosed herein. The flange tab system includes a first member having a first-member-first-portion and a first-member-second-portion, a second member, a third member, a ring-like member, and a plurality of attachment pieces. The second member comprises a second-member-first portion and a second-member-second-portion. The second member is configured to be attached to the first-member-second-portion. The third member configured to be attached to the second-member-second-portion. The ring-like member configured to be removably attached to the second member. The plurality of attachment pieces may include at least 3 pieces made of stainless steel such as 2 nuts and 1 washer. The plurality of attachment pieces may be removably attached to the third member. The first-member-first portion may be circular in shape. Other suitable shapes may be provided based on application and use. The first-member-second-portion is preferably elongate in shape. The first-member-second-portion is integrally connected to the first-member-first-portion. The third member is integrally connected to the second-member-second-portion. The first-member-first-portion has an aperture with a diameter.

A second member includes a plurality of ridges about a length of the second member. A second-member-first-portion-diameter is larger than a second-member-second-portion diameter. The third member may comprise a bolt. The ring-like member is a locking nut configured to secure the second member in place. The first member is preferably made of laser-cut metal. The flange tab system is configured to secure a wire to a pipeline.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein. The features of the invention which are believed to be novel are particularly pointed out and distinctly claimed in the concluding portion of the specification. These and other features, aspects, and advantages of the present invention will become better understood with reference to the following drawings and detailed description.

BRIEF DESCRIPTION OF THE DRAWINGS

The figures which accompany the written portion of this specification illustrate embodiments and methods of use for the present disclosure, flange tab system, constructed and operative according to the teachings of the present disclosure.

The various embodiments of the present invention will hereinafter be described in conjunction with the appended drawings, wherein like designations denote like elements.

DETAILED DESCRIPTION

As discussed above, embodiments of the present disclosure relate to adaptors and connectors and more particularly to a flange tab system as used to minimize corrosion.

In some instances, it may be advantageous to connect two or more pipelines together with wire or cable. The present invention provides means to connect a wire to a pipeline, and is particularly advantageous for securely and efficiently securing a wire or cable to pipelines. The invention includes an approximately 10 mm metal that is preferably laser cut to the different sizes of flange studs that they fit on. They may be manufactured in various shapes, including round on the end so they can be used at virtually any angle of the flange pipe that they attach to. These plates are then welded onto a plug approximately one-inch diameter. On the other end of the plug there is a threaded bolt welded on. The size of this threaded bolt and plug may be altered to meet any size required by the purchaser. There are 2 stainless steel nuts and stainless washer put on the bolt. There may be a locking nut on the plug. The device may be used in the oil and gas sector on pipelines and plant facilities.

Figure 1:
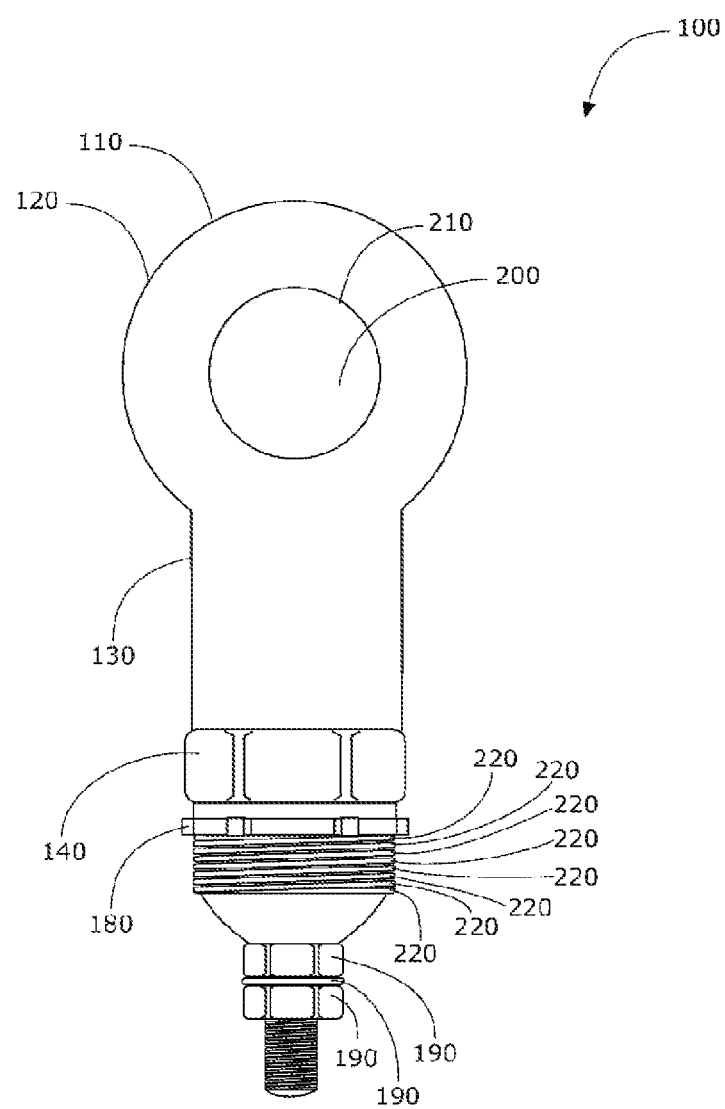
FIG. 1 is a perspective view of the flange tab system during an 'in-use' condition, according to an embodiment of the disclosure.
Figure 2:
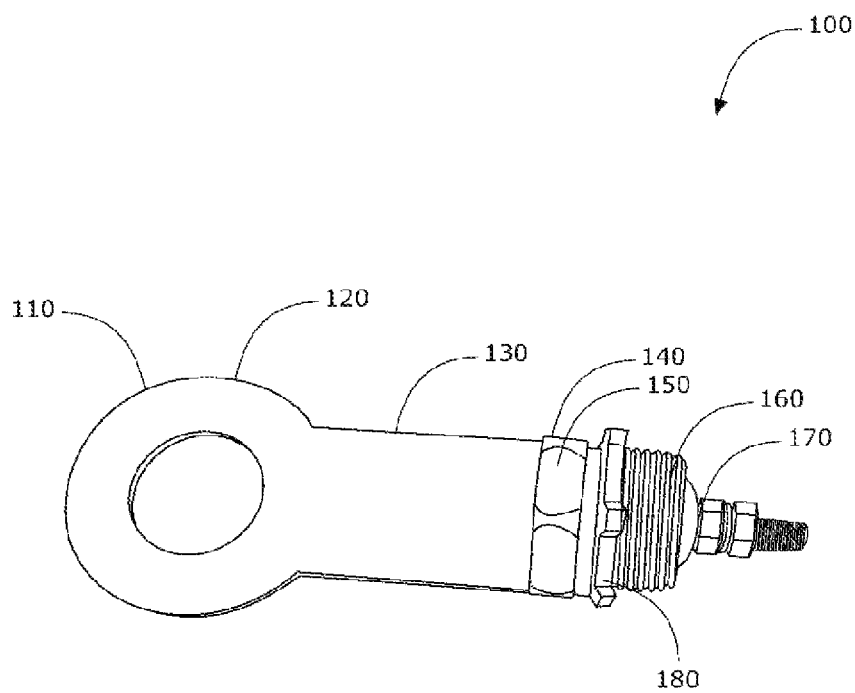
FIG. 2 is a perspective view of the flange tab system of FIG. 1, according to an embodiment of the present disclosure.
Figure 3:
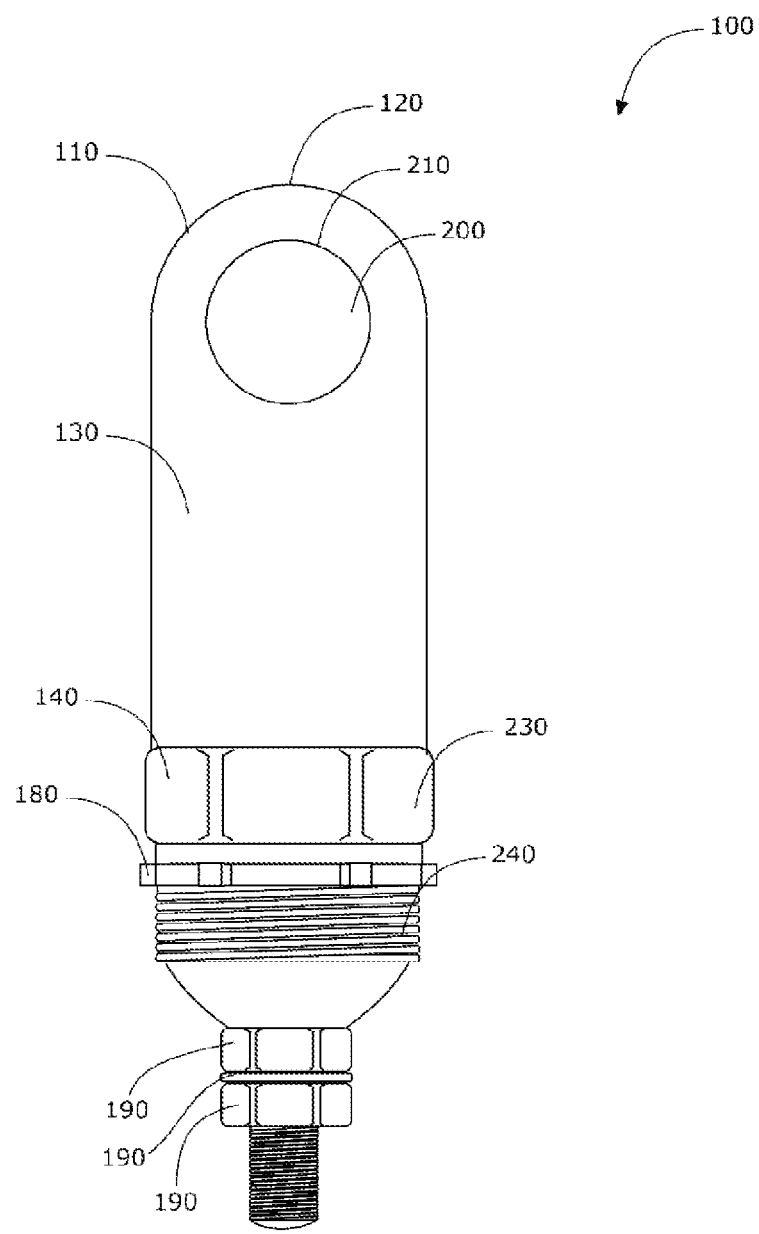
FIG. 3 is a perspective view of the flange tab system of FIG. 1, according to an embodiment of the present disclosure.
Figure 4:
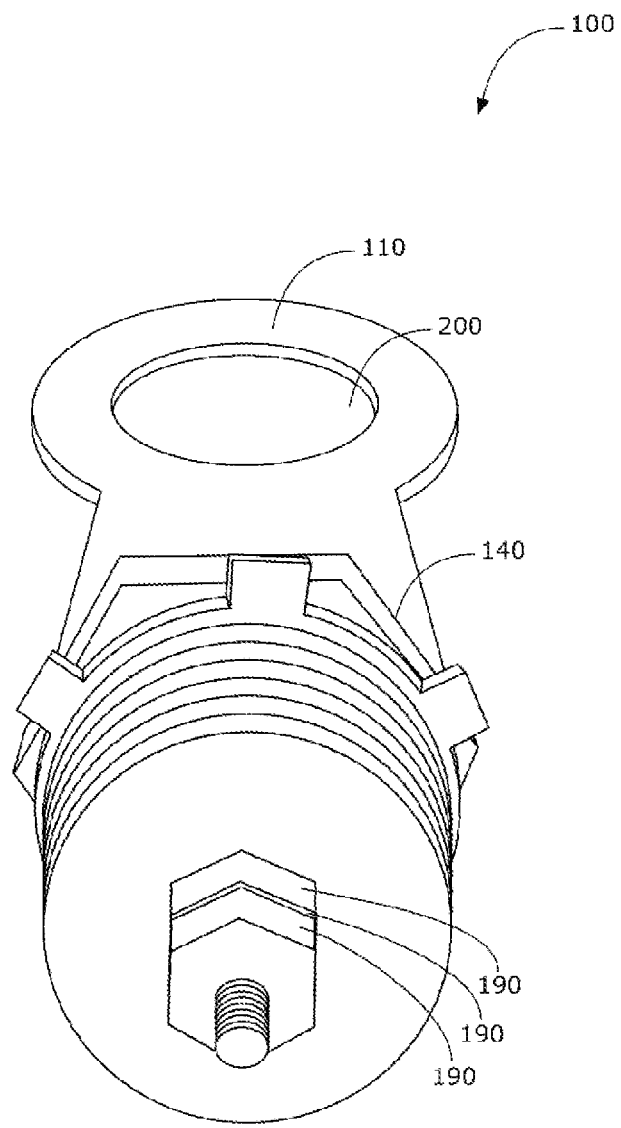
FIG. 4 is a perspective view of the flange tab system of FIG. 1, according to an embodiment of the present disclosure.
Figure 5:
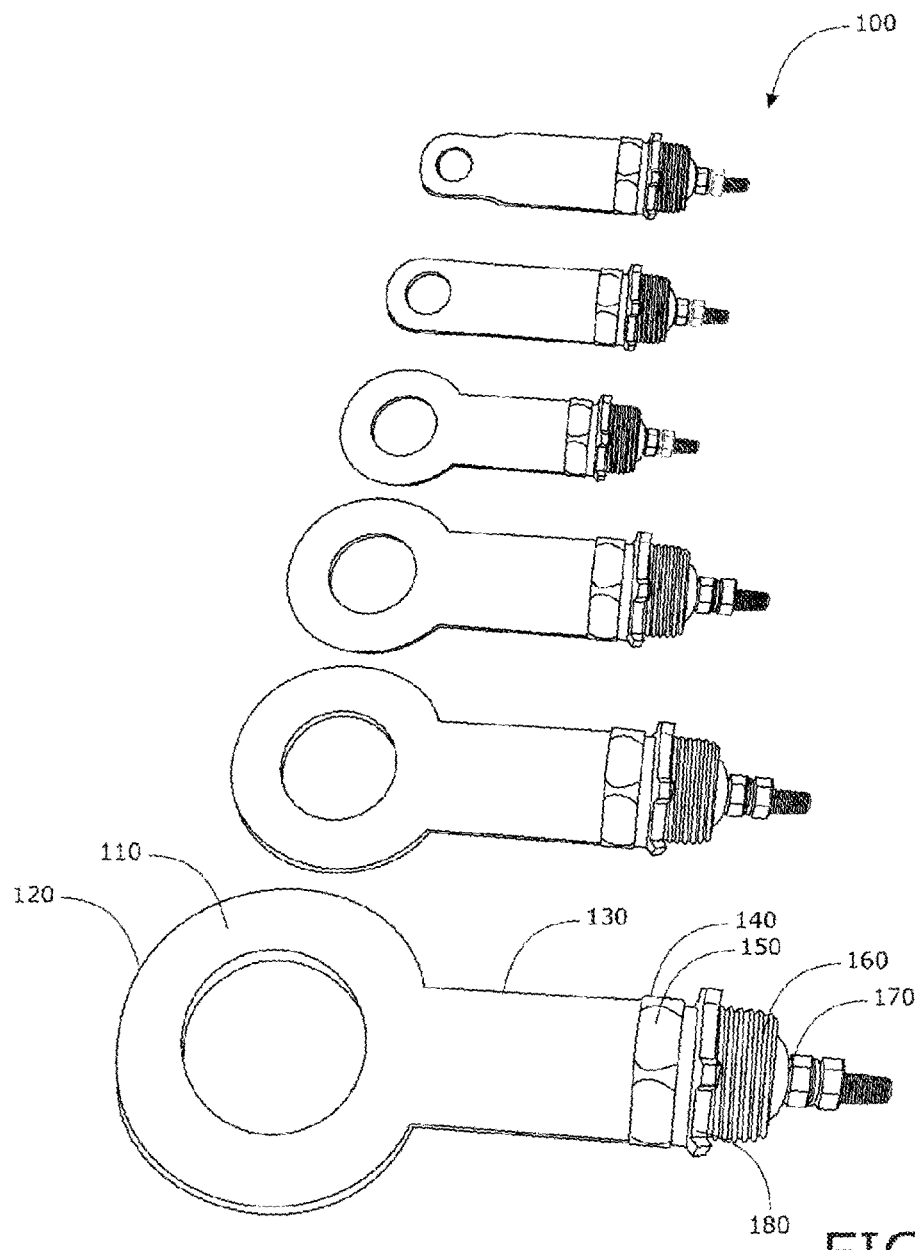
FIG. 5 is a perspective view of the flange tab system of FIG. 1, according to an embodiment of the present disclosure.

Referring now more specifically to the drawings by numerals of reference, there is shown in FIGS. 1-5, various views of a flange tab system 100. FIGS. 1-5 show various views of a flange tab system 100, according to an embodiment of the present disclosure. As illustrated, the flange tab system 100 may include a first member 110 having a first-member-first-portion 120 and a first-member-second-portion 130, a second member 140 having a second-member-first portion 150 and a second-member-second-portion 160, a third member 170, and a ring-like member 180. The second member 140 is configured to be attached to the first-member-second-portion 130. The third member 170 is configured to be attached to the second-member-second-portion 160. The ring-like member 180 is configured to be removably attached to the second member 140. The flange tab system 100 is configured to secure a wire to a pipeline.

The flange tab system 100 may further comprise a plurality of attachment pieces 190. The plurality of attachment pieces 190 may include at least 3 pieces. The plurality of attachment pieces 190 is made of stainless steel or other suitable material. The plurality of attachment pieces 190 may comprise 2 stainless steel nuts and 1 washer which are removably attached to the third member 170. The present invention may include various shapes, thicknesses, sizes, materials and coatings for use in various applications. Other suitable fastening means may be used.

In a preferred embodiment, the first-member-first portion 120 is circular in shape. The ends may be rounded so they can be used at any angle of a flange pipe that they attach to. The first-member-second-portion 130 is elongate in shape. The first-member-second-portion 130 is integrally connected to the first-member-first-portion 120. The third member 170 is integrally connected to the second-member-second-portion 160. The first-member-first-portion 120 has an aperture 200 having a diameter 210. The first member 110 may comprise laser-cut metal.

A second member 140 may include a plurality of ridges 220 about a length of the second member 140. A second-member-first-portion-diameter 230 is larger than a second-member-second-portion diameter 240. The third member 170 may comprise a bolt. The ring-like member 180 is a locking nut configured to secure the second member 140 in place. The present invention provides a grounding/bonding adaptor or connector.

The embodiments of the invention described herein are exemplary and numerous modifications, variations and rearrangements can be readily envisioned to achieve substantially equivalent results, all of which are intended to be embraced within the spirit and scope of the invention. Further, the purpose of the foregoing abstract is to enable the U.S. Patent and Trademark Office and the public generally, and especially the scientist, engineers and practitioners in the art who are not familiar with patent or legal terms or phraseology, to determine quickly from a cursory inspection the nature and essence of the technical disclosure of the application.

The invention claimed is:

1. An electrical fitting flange tab device for establishing electrical continuity between pipelines, said electrical fitting flange tab system comprising:
    a first member having a first-member-first-portion and a first-member-second-portion; wherein said first member has two flat opposing faces; wherein said first-member-first-portion has an aperture, wherein said first-member-first portion is circular in shape;
    a second member having a second-member-first portion and a second-member-second-portion, said second-member-first-portion comprising a hexalobular collar configured to be grasped by a wrench, said second-member-second-portion having external threading, and wherein said second member is configured to be attached to said first-member-second-portion;
    a third member, said third-member comprising a threaded shaft, said third member configured to be attached to said second-member-second-portion;
    a ring member, said ring member having internal threaded dimensioned to threadably mate with said second member;
    wherein said first member, said second member, said third member, and said ring member are structured and arranged for electrical current to flow continuously among said first member, said second member, said third member, and said ring member and further structured and arranged such that electrical current flows among said first member, said second member, said third member, and said ring member;
    wherein said ring member is a locking nut structured and arranged to secure said second member in place;
    wherein said aperture is non-axial to each of said second member and said third member;
    wherein said ring member is a locking nut structured and arranged for electric current to flow continuously from the pipeline to said ring member and further structured and arranged such that electrical current flows from the pipeline to said ring member when said ring member is secured to said second member; and
    wherein said electrical fitting flange tab system is configured to secure an electrical wire to the pipeline and establish electrical continuity between the pipelines that enables electrical current to flow between the pipelines.

2. The electrical fitting flange tab device of claim 1, further comprising a plurality of attachment pieces.

3. The electrical fitting flange tab device of claim 2, wherein said plurality of attachment pieces comprises at least three pieces.

4. The electrical fitting flange tab device of claim 2, wherein said plurality of attachment pieces is made of stainless steel.

5. The electrical fitting flange tab device of claim 2, wherein said plurality of attachment pieces includes two nuts and one washer.

6. The electrical fitting flange tab device of claim 2, wherein said plurality of attachment pieces is removably attached to said third member.

7. The electrical fitting flange tab device of claim 1, wherein said first-member-second-portion is elongate in shape.

8. The electrical fitting flange tab device of claim 1, wherein said first-member-second-portion is integrally connected to said first-member-first-portion.

9. The electrical fitting flange tab device of claim 1, wherein said third member is integrally connected to said second-member-second-portion.

10. The electrical fitting flange tab device of claim 1, wherein said aperture has a diameter.

11. The electrical fitting flange tab device of claim 1, wherein second member includes a plurality of ridges about a length of said second member.

12. The electrical fitting flange tab device of claim 1, wherein a second-member-first-portion-diameter is larger than a second-member-second-portion diameter.

13. The electrical fitting flange tab device of claim 1, wherein said third member is a bolt.

14. The electrical fitting flange tab device of claim 1, wherein said first member is made of laser-cut metal.

15. An electrical fitting flange tab system for securing a wire to a pipeline, said electrical fitting flange tab system comprising:
- a first member having a first-member-first-portion and a first-member-second-portion;
- a second member having a second-member-first portion and a second-member-second-portion, and wherein said second member is configured to be attached to said first-member-second-portion;
- a third member, said third member configured to be attached to said second-member-second-portion;
- a ring member, said ring member configured to be removably attached to said second member;
- further comprising a plurality of attachment pieces;
- wherein said plurality of attachment pieces comprises at least 3 pieces;
- wherein said plurality of attachment pieces is made of stainless steel;
- wherein said plurality of attachment pieces includes two nuts and one washer;
- wherein said plurality of attachment pieces is removably attached to said third member;
- wherein said first-member-first portion is circular in shape;
- wherein said first-member-second-portion is elongate in shape;
- wherein said first-member-second-portion is integrally connected to said first-member-first-portion;
- wherein said third member is integrally connected to said second-member-second-portion;
- wherein said first-member-first-portion has an aperture;
- wherein said aperture has a diameter;
- wherein second member includes a plurality of ridges about a length of said second member;
- wherein a second-member-first-portion-diameter is larger than a second-member-second-portion diameter;
- wherein said third member is a bolt;
- wherein said ring member is a locking nut configured to secure said second member in place;
- wherein said first member, said second member, said third member, and said ring member are structured and arranged for electrical current to flow continuously among said first member, said second member, said third member, and said ring member and further structured and arranged such that electrical current flows among said first member, said second member, said third member, and said ring member;
- wherein said ring member is a locking nut structured and arranged to secure said second member in place;
- wherein said ring member is a locking nut structured and arranged for electric current to flow continuously from the pipeline to said ring member and further structured and arranged such that electrical current flows from the pipeline to said ring member when said ring member is secured to said second member; and
- wherein said electrical fitting flange tab system is configured to secure the electrical wire to the pipeline and establish electrical continuity between multiples of the pipeline that enables electrical current to flow between said multiples of the pipeline said multiples of the pipeline.

* * * * *